(12) United States Patent
Pasqualini (10) Patent No.: US 7,038,898 B1
(45) Date of Patent: May 2, 2006

(54) ESD PROTECTION CIRCUIT THAT CAN TOLERATE A NEGATIVE INPUT VOLTAGE DURING NORMAL (NON-ESD) OPERATION

(75) Inventor: Ronald Pasqualini, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/067,243

(22) Filed: Feb. 24, 2005

(51) Int. Cl.
*H02H 9/04* (2006.01)
*H01L 23/62* (2006.01)

(52) U.S. Cl. .................................... 361/56; 257/355

(58) Field of Classification Search ................ 361/56; 257/355
See application file for complete search history.

(56) References Cited

U.S. PATENT DOCUMENTS

| 6,108,181 A | 8/2000 | Gerosa ........................ 361/56 |
| 6,163,199 A | 12/2000 | Miske et al. ................ 327/434 |

OTHER PUBLICATIONS

Ker et al., "ESD Protection for IC with Power-down-mode Operation", May 2004, Proceedings of the 2004 International Symposium on Circuits and Systems ISCAS, vol. 2, pp. 717-720.*

* cited by examiner

*Primary Examiner*—Evan Pert
(74) *Attorney, Agent, or Firm*—Mark C. Pickering (57) ABSTRACT

An electrostatic discharge (ESD) protection circuit includes a diode that is connected between a pad and a power supply line, and a negative protection circuit that is connected between the pad and a ground line. The negative protection circuit allows the pad voltage to go below ground during normal (non-ESD) operation, and provides adequate ESD protection during an ESD event.

12 Claims, 5 Drawing Sheets

ESD PROTECTION CIRCUIT THAT CAN TOLERATE A NEGATIVE INPUT VOLTAGE DURING NORMAL (NON-ESD) OPERATION

BACKGROUND OF THE INVENTION

1. Field of the Invention

The present invention relates to ESD protection circuits and, more particularly, to an ESD protection circuit that can tolerate a negative input voltage during normal (non-ESD) operation.

2. Description of the Related Art

During normal operation, the inputs and outputs of most CMOS chips usually range between ground and the supply voltage. However, for certain current switched output drivers that are transformer coupled, the voltage levels at the output pads can swing below ground during normal circuit operation.

Figure 1:
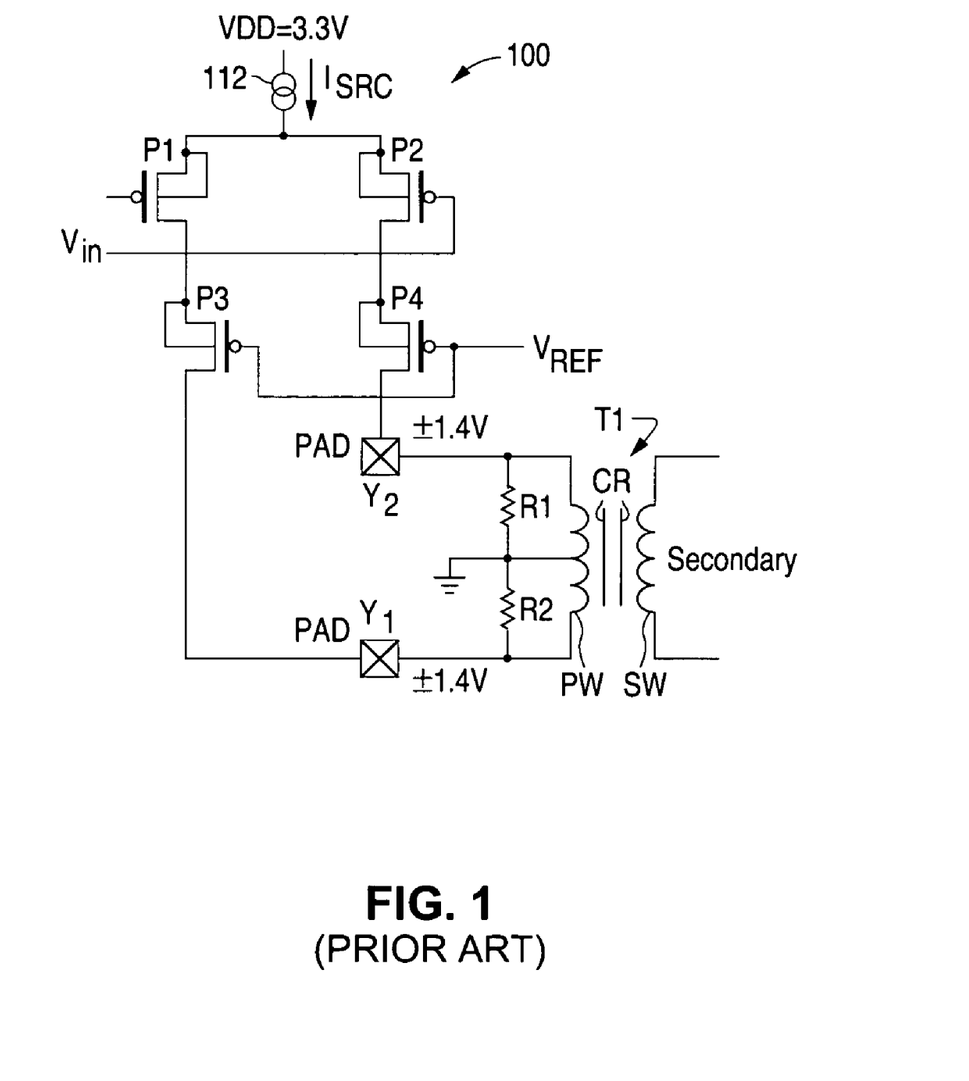
FIG. 1 is a circuit diagram illustrating a prior art output driver 100 that is current switched and transformer coupled.

FIG. 1 shows a circuit diagram that illustrates a prior art output driver 100 that is current switched and transformer coupled. As shown in FIG. 1, output driver 100 includes two PMOS transistors, P1 and P2, that steer current from the VDD power supply to ground through the primary windings of transformer T1. PMOS transistors P1 and P2 are driven by a current source 112, that generates a current $I_{SRC}$. In normal circuit operation, PMOS transistor P1 will be on and PMOS transistor P2 will be off, or vice versa.

When PMOS transistor P1 is on and PMOS transistor P2 is off, the $I_{SRC}$ current will flow from the VDD power supply to ground through PMOS transistor P1, PMOS transistor P3, and the transformer primary winding connected to PAD Y1. Similarly, when PMOS transistor P2 is on and PMOS transistor P1 is off, the $I_{SRC}$ current will flow from the VDD power supply to ground through PMOS transistor P2, PMOS transistor P4, and the transformer primary winding connected to PAD Y2.

The two current paths described above cause the primary current in transformer T1 to reverse direction. This current reversal, in turn, causes the secondary voltage in transformer T1 to reverse its polarity, generating a logic 1 or a logic zero.

As further shown in FIG. 1, output driver 100 includes a PMOS transistor P3 that is connected to transistor P1, and a pad Y1 that is connected to transistor P3. Output driver 100 also includes a PMOS transistor P4 that is connected to transistor P2, and a pad Y2 that is connected to transistor P4.

Transistors P3 and P4, which have their gates connected to an intermediate reference voltage ($V_{REF}$), are cascode devices. Thus transistors P3 and P4 reduce the maximum voltage across transistors P1 and P2 by approximately a factor of two. For example, when the power supply voltage is 3.3V and the maximum negative swing is −1.4V, then transistors P3 and P4 reduce the maximum voltage drop across transistors P1 and P2 from 4.7V (3.3V+1.4V) to approximately 2.35V.

As shown in FIG. 1, output driver 100 includes a transformer T1 that has a primary winding PW, a secondary winding SW, and a core CR. In addition, transformer T1 also includes a center tap that is connected to ground, and a pair of identical resistors R1 and R2 that are connected between the center tap and pads Y2 and Y1, respectively. The resistors R1 and R2, in turn, are used to control the impedance seen at the transformer secondary winding SW.

During normal circuit operation, transistors P1 and P2 steer the $I_{SRC}$ current to ground through transformer T1 and resistors R1 and R2. Thus, as shown in FIG. 1, the steered $I_{SRC}$ current causes the voltages at output pads Y1 and Y2 to range from +1.4V to −1.4V. Although the +1.4V level is quite acceptable, the −1.4V level creates a serious problem for the ESD protection circuitry that is connected to pads Y1 and Y2.

Figure 2:
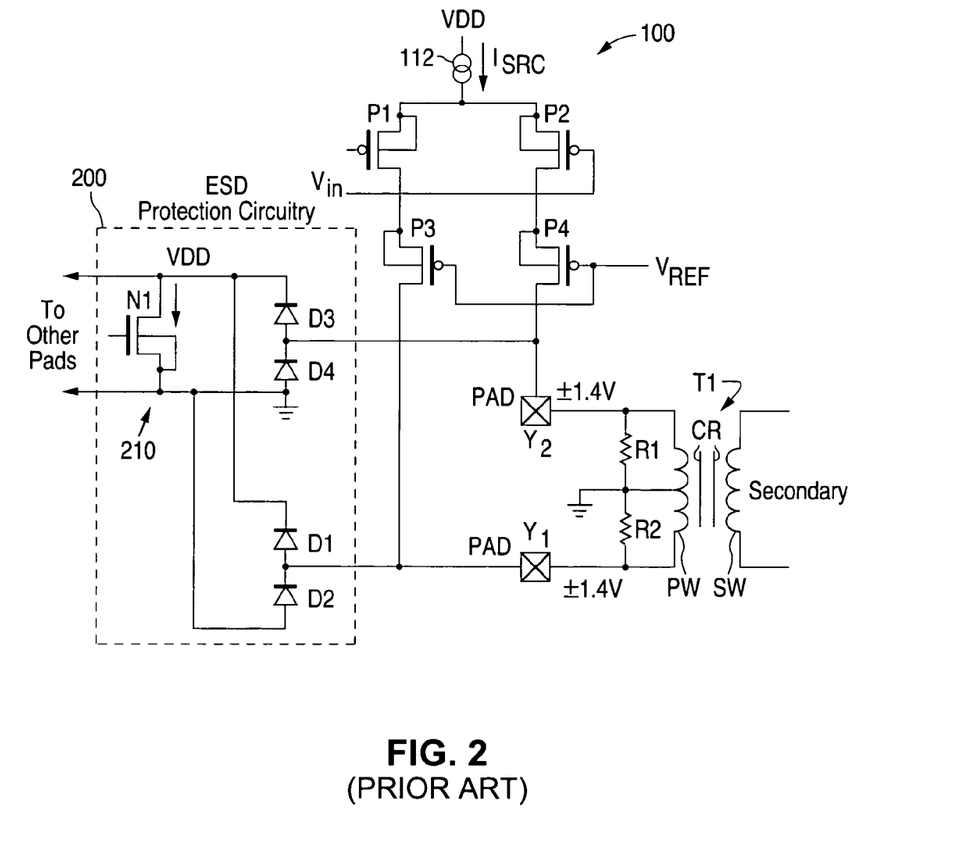
FIG. 2 is a circuit diagram illustrating an example of a prior art ESD protection circuit 200 connected to output driver 100.

FIG. 2 shows a circuit diagram that illustrates an example of a prior art ESD protection circuit 200 connected to output driver 100. As discussed in greater detail below, ESD protection circuit 200 has a serious limitation that prevents the voltages on pads Y1 and Y2 of output driver 100 from reaching the required minimum voltage level of −1.4V.

Referring to FIG. 2, ESD protection circuit 200 includes two diodes, D1 and D2, that are connected to pad Y1. The cathode of diode D1 is connected to the power supply voltage VDD, and the anode of diode D1 is connected to pad Y1. Furthermore, the cathode of diode D2 is connected to pad Y1, and the anode of diode D2 is connected to the ground line.

Similarly, ESD protection circuit 200 also includes two diodes, D3 and D4, that are connected to pad Y2. The cathode of diode D3 is connected to the power supply voltage VDD, and the anode of diode D3 is connected to pad Y2. Furthermore, the cathode of diode D4 is connected to pad Y2, and the anode of diode D4 is connected to the ground line.

Referring to FIG. 2, ESD protection circuit 200 also includes an ESD switch 210 which, in the FIG. 2 example, is implemented with an NMOS transistor N1. During normal (non-ESD) operating conditions, switch 210 (e.g. transistor N1) will remain off. However, during an ESD event, switch 210 (e.g. transistor N1) will turn on in order to conduct ESD current between the two pads that are being zapped.

For example, if pad Y2 is zapped positive with respect to pad Y1, ESD current will flow from pad Y2 to pad Y1 through the following series of circuit elements: diode D3, switch 210, and diode D2. Similarly, if pad Y1 is zapped positive with respect to pad Y2, ESD current will flow from pad Y1 to pad Y2 through the following series circuit elements: diode D1, switch 210 and diode D4.

Referring to FIG. 2, it can be seen that when pad Y2 attempts to reach −1.4V during normal (non-ESD) circuit operation, diode D4 will conduct current in the forward direction when the output voltage at pad Y2 reaches approximately −0.7V. This limits the minimum output voltage at pad Y2 to approximately −0.7V, only one forward diode drop below ground. This is a serious limitation because it prevents the negative voltage level at pad Y2 from reaching the required value of −1.4V.

Similarly, when pad Y1 attempts to reach −1.4V during normal (non-ESD) circuit operation, diode D2 will conduct current in the forward direction when the output voltage at pad Y1 reaches approximately −0.7V. This limits the minimum output voltage at pad Y1 to approximately −0.7V, only one forward diode drop below ground. This is also a serious limitation because it prevents the negative voltage level at pad Y1 from reaching the required value of −1.4V.

A possible solution to the above negative voltage limitations would be to replace diode D2 in FIG. 2 with two or more diodes connected in series. Similarly, diode D4 could also be replaced with two or more diodes connected in series. For example, three diodes connected in series would allow a minimum output voltage of three forward diode drops below ground, or approximately −2.1V (−0.7V*3). Unfortunately, as described in greater detail below, this diode replacement is not possible using prior art ESD diodes.

Figure 3A:
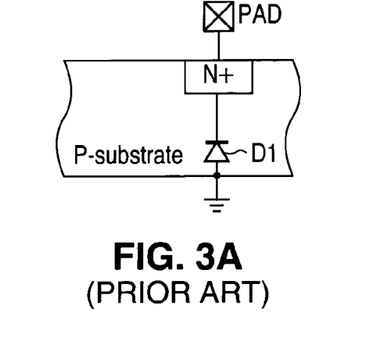
FIGS. 3A and 3B are cross-sectional and schematic diagrams, respectively, illustrating a prior art ESD diode D1.
Figure 3B:
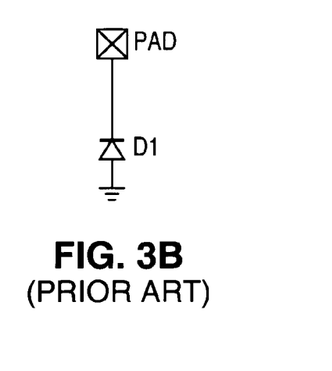

FIGS. 3A and 3B show a cross-sectional diagram and a schematic diagram, respectively, that illustrate a prior art ESD diode D1. Diode D1 has an N+ doped region connected to a pad that forms a cathode, and a grounded P– substrate connected to the N+ doped region that form an anode. Although the N+ cathode of diode D1 is floating and can be connected to a pad, the P– anode of diode D1 cannot float because it is formed by the grounded P– substrate. Thus, for ESD purposes, two or more D1 diodes cannot be stacked (i.e. connected in series) because they do not have floating anodes.

Figure 4A:
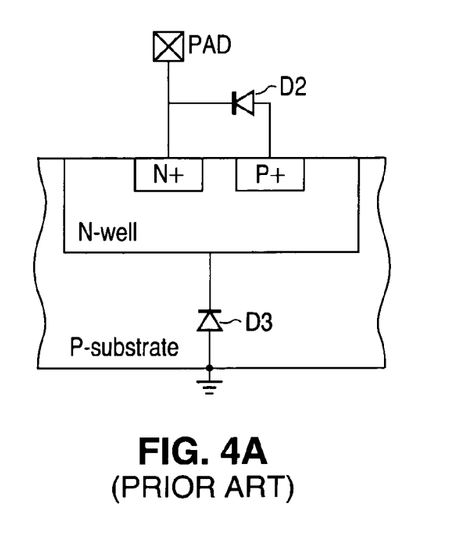
FIGS. 4A and 4B are cross-sectional and schematic diagrams, respectively, illustrating a prior art ESD diode D2.
Figure 4B:
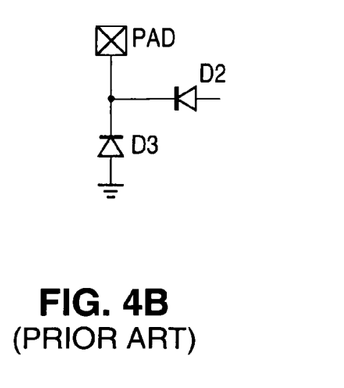

FIGS. 4A and 4B show a cross-sectional diagram and a schematic diagram, respectively, that illustrate a prior art ESD diode D2. Diode D2 has an N– well connected to a pad (via an N+ contact region) that forms a cathode. Furthermore, diode D2 also has a P+ doped region located inside of the N– well that forms an anode.

As shown in FIGS. 4A and 4B, the P+ anode of diode D2 is floating. In addition, the N– cathode of diode D2 is also floating and is connected to a pad. Nevertheless, as shown in FIG. 4B, the N– cathode of D2 cannot go below ground by more than one forward diode drop, due to the presence of parasitic diode D3.

Referring to FIGS. 4A and 4B, parasitic diode D3 is an N–/P– diode whose cathode is formed by the N– well and whose anode is formed by the grounded P– substrate. Furthermore, the cathode of diode D3 is connected to the cathode of diode D2, and both cathodes are connected to the pad. Nevertheless, if the connected cathodes of diodes D2 and D3 receive a negative voltage with respect to ground, their negative cathode voltage will be limited to only one forward diode drop below ground. This limitation exists because parasitic diode D3 will begin to conduct current in the forward direction when its cathode voltage attempts to go more negative than one forward diode drop below ground.

Thus, even though diode D2 is a floating diode, its cathode voltage cannot go more negative than one forward diode drop below ground. Thus, for ESD purposes, two or more D2 diodes cannot be stacked (i.e. connected in series), in order to increase the allowable negative voltage drop at the pad.

In light of the above limitations, there is a definite need for an improved ESD protection circuit that will allow substantially negative voltage levels at the chip I/O pads during normal (non-ESD) circuit operation.

DETAILED DESCRIPTION OF THE INVENTION

Figure 5:
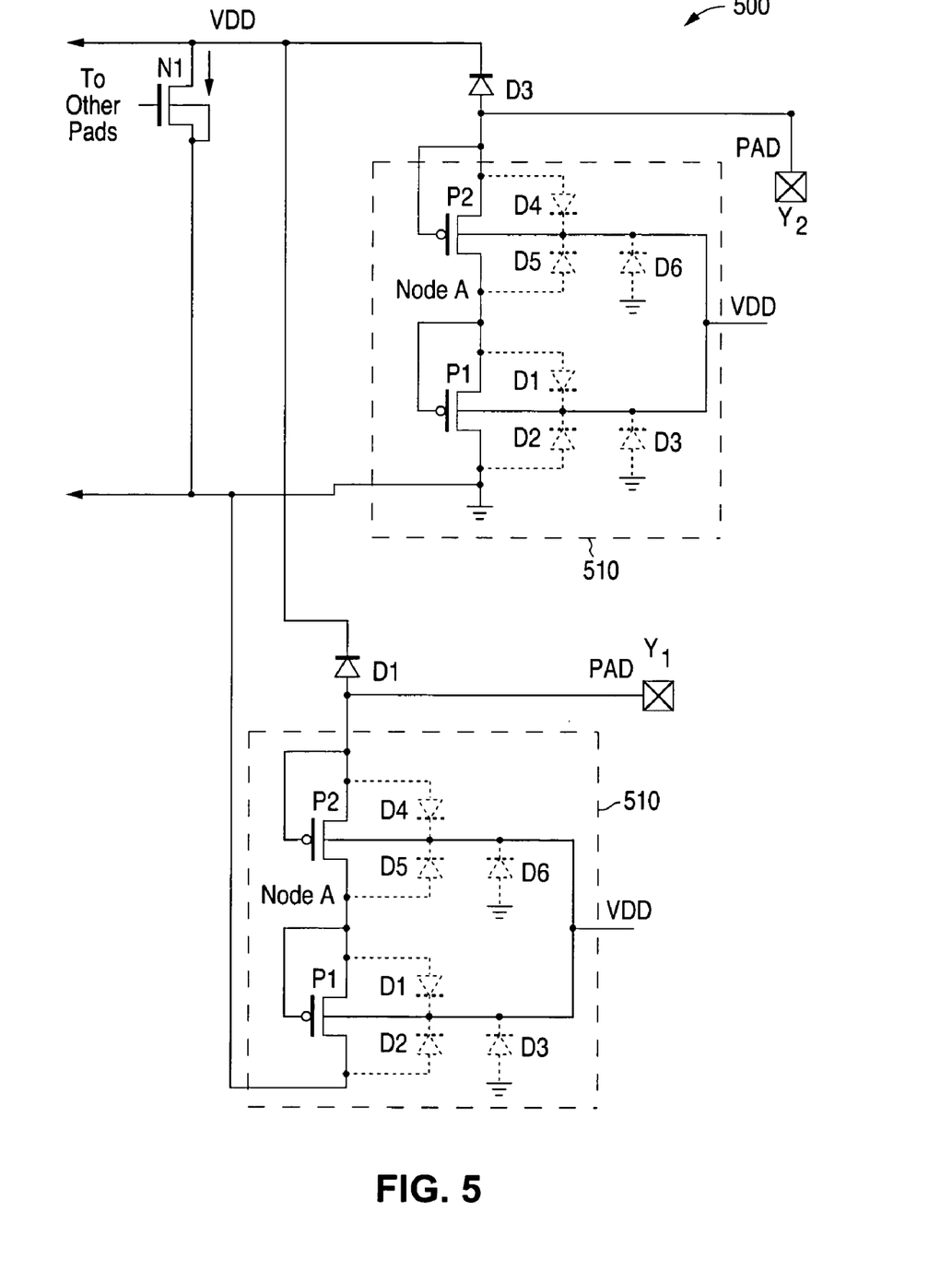
FIG. 5 is a schematic diagram illustrating an ESD protection circuit 500 in accordance with the present invention.

In accordance with the present invention, FIG. 5 shows a schematic diagram that illustrates an ESD protection circuit 500. As described in greater detail below, ESD protection circuit 500 allows the pad voltage to go below ground by more than one forward diode drop, during normal (non-ESD) circuit operation. Furthermore, circuit 500 also provides adequate ESD protection during an ESD event.

ESD protection circuit 500 is similar to ESD protection circuit 200 and, as a result, utilizes the same reference labels to designate the structures that are common to both circuits. As shown in FIG. 5, circuit 500 differs from circuit 200 in that circuit 500 utilizes negative protection circuits 510 in lieu of ESD diodes D2 and D4.

Referring to FIG. 5, each negative protection circuit 510 includes two PMOS devices, P1 and P2, that are connected in series. PMOS transistor P1 has an N– region (a substrate region or well) that is connected to a supply voltage VDD, a P+ source formed in the N-region, and a spaced-apart P+ drain formed in the N– region.

In addition, PMOS transistor P1 also has a channel region located in the N– region that lies between the P+ source and P+ drain regions. Furthermore, PMOS transistor P1 has a gate oxide region that lies on the N– region over the channel region, and a gate that lies on the gate oxide region over the channel region. In addition, transistor P1 also has three parasitic diodes associated with it, including the source/drain diodes D1/D2, and the well-to-substrate diode D3.

Similarly, PMOS transistor P2 has an N– region (a substrate region or well) that is connected to a supply voltage VDD, a P+ source formed in the N– region, and a spaced-apart P+ drain formed in the N– region. In addition, PMOS transistor P2 also has a channel region located in the N– region that lies between the P+ source and P+ drain regions. Furthermore, PMOS transistor P2 has a gate oxide region that lies on the N– region over the channel region, and a gate that lies on the gate oxide region over the channel region. In addition, transistor P2 also has three parasitic diodes associated with it, including the source/drain diodes D4/D5, and the well-to-substrate diode D6.

Each negative protection circuit 510 also has two operating modes: a normal (non-ESD) operating mode and an ESD operating mode. In addition, the normal operating mode has two sub modes: a positive pad voltage (with respect to ground) and a negative pad voltage (with respect to ground).

When the pad voltage goes positive during normal circuit operation, the six parasitic diodes in the negative protection circuit 510 cannot become forward biased because their cathodes (their N-substrate regions or wells) are connected to the positive supply voltage VDD. Thus, when the pad voltage goes positive during normal circuit operation, none of the parasitic diodes shown in negative protection circuit 510 will conduct forward current.

Furthermore, when the pad voltage goes positive during normal circuit operation, node A in negative protection circuit 510 will become the source of PMOS transistor P1. Thus, because the gate of transistor P1 is also connected to node A, the gate-to-source voltage of transistor P1 will be equal to zero. Consequently, when the pad voltage goes positive during normal circuit operation, transistor P1 will remain off because its gate to source voltage will be equal to zero.

Similarly, when the pad voltage goes positive during normal circuit operation, the pad voltage will become the source terminal of PMOS transistor P2. Thus, because the gate of transistor P2 is also connected to the pad, the gate-to-source voltage of transistor P2 will be equal to zero. As a result, when the pad voltage goes positive during normal circuit operation, transistor P2 will remain off because its gate-to-source voltage will be equal to zero.

In summary, when the pad voltage goes positive during normal circuit operation, transistors P1 and P2 will remain off and will not conduct any forward current. This is the desired behavior during normal circuit operation.

When the pad voltage goes negative during normal circuit operation, all of the parasitic diodes in negative protection circuit 510 will be reverse biased. Thus, when the pad voltage goes negative during normal circuit operation, none of the parasitic diodes in negative protection circuit 510 will conduct forward current.

In addition, when the pad voltage goes negative during normal circuit operation, PMOS transistors P1 and P2 will remain off if the pad voltage is more positive than the sum of two PMOS threshold voltages (i.e. $-2*V_{TP}$). For example, if the PMOS threshold voltage is $-1V$, PMOS transistors P1 and P2 will remain off if the pad voltage is more positive than $-2V$. Although this negative voltage limitation is sufficient for many applications, it can be further extended using an alternate circuit implementation of the current invention, as described in the paragraphs below.

When negative protection circuit 510 is operating in ESD mode, and the pad to which it is attached is zapped negative with respect to another pad, protection circuit 510 must behave as if it were the equivalent of a forward biased diode, with an anode connected to the ground line and a cathode connected to the pad. In other words, when a negative ESD event occurs at the pad, the ESD current must have a path from the ground line to the pad.

Figure 6:
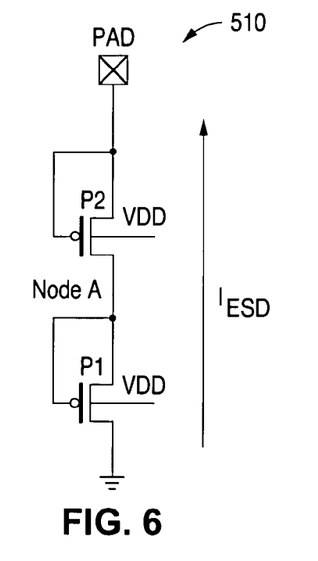
FIG. 6 is a schematic diagram illustrating the operation of an ESD protection circuit 510 during a negative ESD event, in accordance with the present invention.

In accordance with the present invention, FIG. 6 shows a schematic diagram that illustrates the current path through negative protection circuit 510 during a negative ESD event. Referring to FIG. 6, when the ground line voltage becomes more positive than the negative voltage on the pad, an ESD current $I_{ESD}$ will flow from ground to node A (through transistor P1), and from node A to the pad (through transistor P2). Thus, in ESD mode, when the pad to which negative protection circuit 510 is attached is zapped negative with respect to another pad, the ground line will be the source of transistor P1, and node A will be the drain of transistor P1.

Furthermore, since the gate of PMOS transistor P1 is connected to node A (i.e. to the drain of PMOS transistor P1), transistor P1 will have a negative gate-to-source voltage. Thus, because the gate-to-source voltage of PMOS transistor P1 is negative, transistor P1 will turn on during a negative ESD event, thereby allowing the ESD current $I_{ESD}$ to flow through transistor P1, in the direction shown in FIG. 6. Furthermore, if the width of transistor P1 is made sufficiently large, the voltage drop across transistor P1 will be approximately equal to the threshold voltage of transistor P1 ($-1V$ in the present example).

In addition, when the voltage on the ground line spikes up and transistor P1 turns on, the node A side of transistor P2 will become more positive than the side of transistor P2 that is connected to the pad. Thus, during a negative ESD event at the pad, node A will become the source of transistor P2, and the pad will become the drain of transistor P2.

Furthermore, since the gate of PMOS transistor P2 is connected to the pad (i.e. to the drain of PMOS transistor P2), transistor P2 will have a negative gate-to-source voltage. Thus, because the gate-to-source voltage of transistor P2 is negative, transistor P2 will turn on during a negative ESD event, thereby allowing the ESD current $I_{ESD}$ to flow through transistor P2, in the direction shown in FIG. 6. Furthermore, if the width of transistor P2 is made sufficiently large, the voltage drop across transistor P2 will be approximately equal to the threshold voltage of transistor P2 ($-1V$ in the present example).

In summary, when a negative ESD event occurs at the pad, PMOS transistors P1 and P2 will both turn on, and the voltage drop across the two transistors will be approximately equal to two PMOS threshold drops, $-2*V_{TP}$ ($-2V$ in the current example).

Figure 7:
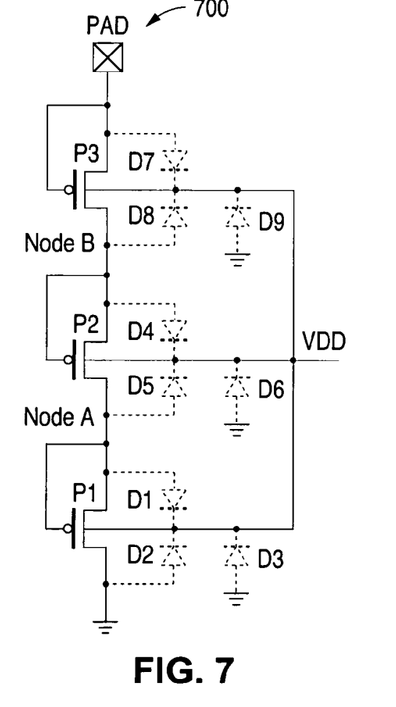
FIG. 7 is a schematic diagram illustrating the operation of an ESD protection circuit 700, in accordance with an alternate embodiment of the present invention.

In accordance with an alternate embodiment of the present invention, FIG. 7 shows a schematic diagram that illustrates a negative protection circuit 700. In comparison to negative protection circuit 510, negative protection circuit 700 allows the pad voltage to go more negative during normal (non-ESD) circuit operation. Furthermore, negative protection circuit 700 also provides adequate ESD protection during an ESD event.

As shown in FIG. 7, negative protection circuit 700 includes three PMOS devices (P1, P2 and P3) connected in series. Transistor P1 has three parasitic diodes associated with it, including the source/drain diodes D1/D2, and the well-to-substrate diode D3. Similarly, transistor P2 also has three parasitic diodes associated with it, including the source/drain diodes D4/D5, and the well-to-substrate diode D6. Furthermore, transistor P3 has three parasitic diodes associated with it, including the source/drain diodes D7/D8, and the well-to-substrate diode D9.

Negative protection circuit 700 has two operating modes: a normal (non-ESD) operating mode and an ESD operating mode. In addition, the normal operating mode has two sub modes: a positive pad voltage (with respect to ground) and a negative pad voltage (with respect to ground).

When the pad voltage goes positive during normal circuit operation, the nine parasitic diodes in negative protection circuit 700 cannot become forward biased because their cathodes (their N-substrate regions or wells) are connected to the positive supply voltage VDD. Thus, when the pad voltage goes positive during normal circuit operation, none of the parasitic diodes shown in negative protection circuit 700 will conduct forward current.

Furthermore, when the pad voltage goes positive during normal circuit operation, node A becomes the source of PMOS transistor P1. Thus, because the gate of transistor P1 is also connected to node A, the gate-to-source voltage of transistor P1 will be equal to zero. Consequently, when the pad voltage goes positive during normal circuit operation, transistor P1 will remain off because its gate-to-source voltage will be equal to zero.

Similarly, when the pad voltage goes positive during normal circuit operation, node B becomes the source terminal of PMOS transistor P2. Thus, because the gate of transistor P2 is also connected to node B, the gate-to-source voltage of transistor P2 will be equal to zero. Consequently, when the pad voltage goes positive during normal circuit operation, transistor P2 will remain off because its gate-to-source voltage will be equal to zero.

Furthermore, when the pad voltage goes positive during normal circuit operation, the pad voltage becomes the source of PMOS transistor P3. Thus, because the gate of transistor P3 is also connected to the pad, the gate-to-source voltage of transistor P3 will be equal to zero. As a result, when the pad voltage goes positive during normal circuit operation, transistor P3 will remain off because its gate-to-source voltage will be equal to zero.

In summary, when the pad voltage goes positive during normal circuit operation, transistors P1, P2 and P3 will remain off and will not conduct any forward current. This is the desired behavior during normal circuit operation.

When the pad voltage goes negative during normal circuit operation, all of the parasitic diodes in negative protection circuit 700 will be reverse biased. Thus, when the pad voltage goes negative during normal circuit operation, none of the parasitic diodes in negative protection circuit 700 will conduct forward current.

In addition, when the pad voltage goes negative during normal circuit operation, transistors P1, P2 and P3 will remain off if the pad voltage is more positive than the sum of three PMOS threshold voltages (i.e. $-3*V_{TP}$). For example, if the PMOS threshold voltage is $-1V$, PMOS transistors P1, P2 and P3 will remain off if the pad voltage is more positive than $-3V$.

When negative protection circuit 700 is operating in ESD mode, and the pad to which it is attached is zapped negative with respect to another pad, protection circuit 700 must behave as if it were the equivalent of a forward biased diode, with an anode connected to the ground line and a cathode connected to the pad. In other words, when a negative ESD event occurs at the pad, the ESD current must have a path from the ground line to the pad.

Figure 8:
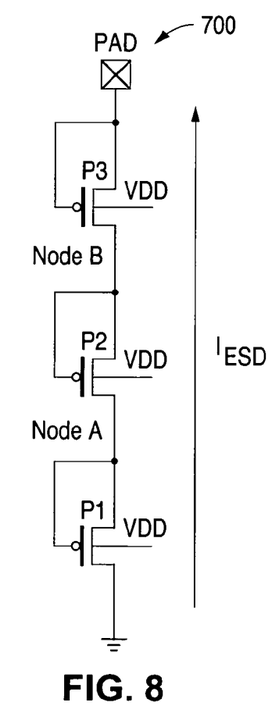
FIG. 8 is a schematic diagram illustrating the operation of an ESD protection circuit 700 during a negative ESD event, in accordance with the present invention.

In accordance with the present invention, FIG. 8 shows a schematic diagram that illustrates the current path through negative protection circuit 700 during a negative ESD event. Referring to FIG. 8, when the ground line voltage becomes more positive than the negative voltage on the pad, an ESD current $I_{ESD}$ will flow from ground to node A (through transistor P1), from node A to node B (through transistor P2), and from node B to the pad (through transistor P3). Thus, in ESD mode, when the pad to which negative protection circuit 700 is attached is zapped negative with respect to another pad, the ground line will be the source of transistor P1, and node A will be the drain of transistor P1.

Furthermore since the gate of PMOS transistor P1 is connected to node A (i.e. to the drain of PMOS transistor P1), transistor P1 will have a negative gate-to-source voltage. Thus, because the gate-to-source voltage of PMOS transistor P1 is negative, transistor P1 will turn on during an ESD event, thereby allowing the ESD current $I_{ESD}$ to flow through transistor P1, in the direction shown in FIG. 8. Furthermore, if the width of transistor P1 is made sufficiently large, the voltage drop across transistor P1 will be approximately equal to the threshold voltage of transistor P1 ($-1V$ in the present example).

In addition, when the voltage on the ground line spikes up and transistor P1 turns on, the node A side of transistor P2 will become more positive than the side of transistor P2 that is connected to node B. Thus, during a negative ESD event at the pad, node A will become the source of transistor P2, and node B will become the drain of transistor P2.

Furthermore, since the gate of transistor P2 is connected to node B (i.e. to the drain of transistor P2), transistor P2 will have a negative gate-to-source voltage. Thus, because the gate-to-source voltage of transistor P2 is negative, transistor P2 will turn on during a negative ESD event, thereby allowing the ESD current $I_{ESD}$ to flow through transistor P2, in the direction shown in FIG. 8. Furthermore, if the width of transistor P2 is made sufficiently large, the voltage drop across transistor P2 will be approximately equal to the threshold voltage of transistor P2 ($-1V$ in the present example).

In addition, when the voltage on the ground line spikes up and transistors P1 and P2 turn on, the node B side of transistor P3 will become more positive than the side of transistor P3 that is connected to the pad. Thus, during a negative ESD event at the pad, node B will be the source of transistor P3, and the pad will be the drain of transistor P3.

Furthermore, since the gate of PMOS transistor P3 is connected to the pad (i.e. to the drain of transistor P3), transistor P3 will have a negative gate-to-source voltage. Thus, because the gate-to-source voltage of transistor P3 is negative, transistor P3 will turn on during a negative ESD event, thereby allowing the ESD current $I_{ESD}$ to flow through transistor P3, in the direction shown in FIG. 8. Furthermore, if the width of transistor P3 is made sufficiently large, the voltage drop across transistor P3 will be approximately equal to the threshold voltage of transistor P3 ($-1V$ in the present example).

In summary, when a negative ESD event occurs at the pad, transistors P1, P2 and P3 will all turn on, and the voltage drop across the three transistors will be approximately equal to three PMOS threshold drops, $-3*V_{TP}$ ($-3V$ in the current example). Because this voltage drop is relatively high, ESD performance may or may not be adequate, depending upon the maximum allowable pad-to-pad voltage during an ESD event.

For example, let us assume that the maximum allowable pad-to-pad voltage drop during an ESD event is 10V. This requires that the total voltage drop across all of the circuit elements in the complete ESD path must be less than or equal to 10V. These circuit elements include: the upper ESD diode (D1 or D3 in FIG. 5), the IR voltage drop across the ESD wiring, the voltage drop across ESD switch 210 in FIG. 2, and the voltage drop across the negative ESD protection circuit shown in FIG. 8.

If the voltage drop across the upper ESD diode is 1.5V, and the IR voltage drop across the ESD wiring is 2V, and the voltage drop across the ESD switch is 3V, the sum of these voltage drops will be equal to 6.5V (1.5V+2V+3V). Thus the maximum voltage drop allowed across the negative ESD protection circuit shown in FIG. 8 would be equal to 3.5V (10V–6.5V). In this example, this is an adequate amount for this voltage drop.

It should be understood that the above descriptions are examples of the present invention, and that various alternatives of the invention described herein may be employed in practicing the invention. Thus, it is intended that the following claims define the scope of the invention, and that structures and methods within the scope of these claims and their equivalents be covered thereby.

What is claimed is:

1. An ESD protection circuit comprising:
   a first MOS transistor having:
   a first semiconductor region of a first conductivity type, the first semiconductor region being connected to a supply voltage;
   a first terminal region of a second conductivity type formed in the first semiconductor region;
   a spaced-apart second terminal region of the second conductivity type formed in the first semiconductor region;
   a first channel region of the first semiconductor region formed between the first and second terminal regions;
   a first gate oxide region formed on the first semiconductor region over the first channel region; and
   a first gate formed on the first gate oxide region over the first channel region, the first gate being connected to the first terminal region; and a second MOS transistor having:
   a second semiconductor region of the first conductivity type, the second semiconductor region being connected to the supply voltage;
   a third terminal region of a second conductivity type formed in the second semiconductor region;
   a spaced-apart fourth terminal region of the second conductivity type formed in the second semiconductor region, the fourth terminal region being electrically connected to the first terminal region;
   a second channel region of the second semiconductor region formed between the third and fourth terminal regions;
   a second gate oxide region formed on the second semiconductor region over the second channel region; and
   a second gate formed on the second gate oxide region over the second channel region, the second gate being connected to the third terminal region.

2. The ESD protection circuit of claim 1 wherein the second terminal region is directly connected to a ground line.

3. The ESD protection circuit of claim 2 wherein the third terminal region is directly connected to a first pad.

4. The ESD protection circuit of claim 3 and further comprising a diode, the diode having an anode connected to the first pad, and a cathode connected to a power supply line.

5. The ESD protection circuit of claim 4 and further comprising an ESD switch connected to the ground line and the power supply line.

6. The ESD protection circuit of claim 5 and further comprising:
   a third MOS transistor having:
      a third semiconductor region of the first conductivity type, the third semiconductor region being connected to the supply voltage;
      a fifth terminal region of the second conductivity type formed in the third semiconductor region;
      a spaced-apart sixth terminal region of the second conductivity type formed in the third semiconductor region, the sixth terminal region being connected to the ground line;
      a third channel region of the third semiconductor region formed between the fifth and sixth terminal regions;
      a third gate oxide region formed on the third semiconductor region over the third channel region; and
      a third gate formed on the third gate oxide region over the third channel region, the third gate being connected to the fifth terminal region; and
   a fourth MOS transistor having:
      a fourth semiconductor region of the first conductivity type, the fourth semiconductor region being connected to the supply voltage;
      a seventh terminal region of the second conductivity type formed in the fourth semiconductor region;
      a spaced-apart eighth terminal region of the second conductivity type formed in the fourth semiconductor region, the eighth terminal region being electrically connected to the fifth terminal region;
      a fourth channel region of the second semiconductor region formed between the seventh and eighth terminal regions;
      a fourth gate oxide region formed on the fourth semiconductor region over the fourth channel region; and
      a fourth gate formed on the fourth gate oxide region over the fourth channel region, the fourth gate being connected to the seventh terminal region.

7. The ESD protection circuit of claim 6 wherein the seventh terminal is directly connected to a second pad.

8. The ESD protection circuit of claim 3 and further comprising a diode having an anode connected to the second pad, and a cathode connected to the power supply line.

9. The ESD protection circuit of claim 2 and further comprising:
   a third MOS transistor having:
      a third semiconductor region of the first conductivity type, the third semiconductor region being connected to the supply voltage;
      a fifth terminal region of the second conductivity type formed in the third semiconductor region, the fifth terminal being connected to a pad;
      a spaced-apart sixth terminal region of the second conductivity type formed in the third semiconductor region, the sixth terminal region being connected to the third terminal region;
      a third channel region of the third semiconductor region formed between the fifth and sixth terminal regions;
      a third gate oxide region formed on the third semiconductor region over the third channel region; and
      a third gate formed on the third gate oxide region over the third channel region, the third gate being connected to the fifth terminal region.

10. The ESD protection circuit of claim 9 and further comprising a diode, the diode having an anode connected to the pad, and a cathode connected to a power supply line.

11. The ESD protection circuit of claim 10 and further comprising an ESD switch connected to the ground line and the power supply line.

12. The ESD protection circuit of claim 11 wherein the first, second, and third MOS transistors are p-channel transistors.

* * * * *